United States Patent
Komori et al.

(10) Patent No.: US 9,856,146 B2
(45) Date of Patent: Jan. 2, 2018

(54) MAGNESIUM OXIDE PARTICLES, MAGNESIUM OXIDE PARTICLE PRODUCTION METHOD, RESIN COMPOSITION AND MOLDED BODY USING SUCH RESIN COMPOSITION, AND ADHESIVE OR GREASE

(71) Applicant: Sakai Chemical Industry Co., Ltd., Sakai-shi, Osaka (JP)

(72) Inventors: Satoshi Komori, Osaka (JP); Harunobu Saito, Osaka (JP); Takumi Kawada, Osaka (JP)

(73) Assignee: Sakai Chemical Industry Co., Ltd., Osaka (JP)

( * ) Notice: Subject to any disclaimer, the term of this patent is extended or adjusted under 35 U.S.C. 154(b) by 62 days.

(21) Appl. No.: 14/888,837

(22) PCT Filed: May 15, 2014

(86) PCT No.: PCT/JP2014/062977
§ 371 (c)(1),
(2) Date: Nov. 3, 2015

(87) PCT Pub. No.: WO2014/188959
PCT Pub. Date: Nov. 27, 2014

(65) Prior Publication Data
US 2016/0083262 A1   Mar. 24, 2016

(30) Foreign Application Priority Data
May 24, 2013   (JP) ................... 2013-110236

(51) Int. Cl.
*C01F 5/02* (2006.01)
*C01F 5/06* (2006.01)
(Continued)

(52) U.S. Cl.
CPC .......... *C01F 5/06* (2013.01); *C01F 5/02* (2013.01); *C01F 5/08* (2013.01); *C01F 5/22* (2013.01);
(Continued)

(58) Field of Classification Search
CPC ...................... C01F 5/02; C01F 5/06
(Continued)

(56) References Cited

U.S. PATENT DOCUMENTS

| 4,677,026 A | 6/1987 | Hamamoto et al. |
| 4,797,159 A * | 1/1989 | Spangle ................. C04B 2/102 |
| | | 106/694 |

(Continued)

FOREIGN PATENT DOCUMENTS

| CN | 1337980 | 2/2002 |
| JP | 62-018441 | 1/1987 |

(Continued)

OTHER PUBLICATIONS

Database WPI, Week 200851, Thomson Scientific, London, GB; AN 2008-J00096, XP002765154, & JP 2008-137845, Jun. 19, 2008 *abstract*—2 pages.

*Primary Examiner* — Ellen McAvoy
(74) *Attorney, Agent, or Firm* — Hamre, Schumann, Mueller & Larson, P.C.

(57) ABSTRACT

An object of the present invention is to provide magnesium oxide particles that have a high heat conductivity and excellent properties as heat-dissipating filler, and can prevent problems such as soft errors in the memory. The magnesium oxide particles have a BET specific surface area of 0.1 to 17 m$^2$/g, and an α dose of 0.005 c/cm$^2$·Hr or lower, the particles exhibiting a relation between an X-ray diffraction peak intensity y (cps) at a Bragg angle (2θ) of 42.80° to 43.00° and the BET specific surface area x (m$^2$/g) as represented by the following inequality (1):

$$y \geq -960x + 33000 \qquad (1).$$

12 Claims, 1 Drawing Sheet

(51) Int. Cl.

| | | |
|---|---|---|
| C08K 3/22 | (2006.01) | |
| C09C 1/36 | (2006.01) | |
| C09J 11/04 | (2006.01) | |
| C10M 113/08 | (2006.01) | |
| C10M 125/10 | (2006.01) | |
| C09J 163/00 | (2006.01) | |
| C08L 101/00 | (2006.01) | |
| H01L 23/373 | (2006.01) | |
| C08K 9/02 | (2006.01) | |
| C01F 5/08 | (2006.01) | |
| C01F 5/22 | (2006.01) | |

(52) U.S. Cl.
CPC ............... *C08K 3/22* (2013.01); *C08K 9/02* (2013.01); *C08L 101/00* (2013.01); *C09C 1/36* (2013.01); *C09J 11/04* (2013.01); *C09J 163/00* (2013.01); *C10M 113/08* (2013.01); *C10M 125/10* (2013.01); *H01L 23/3737* (2013.01); *C01P 2002/72* (2013.01); *C01P 2006/12* (2013.01); *C01P 2006/32* (2013.01); *C01P 2006/80* (2013.01); *C08K 2003/222* (2013.01); *C10M 2201/062* (2013.01); *C10M 2209/1003* (2013.01); *C10M 2209/1013* (2013.01); *C10N 2210/02* (2013.01); *C10N 2220/082* (2013.01); *C10N 2250/08* (2013.01); *C10N 2250/10* (2013.01); *C10N 2270/00* (2013.01); *H01L 2924/0002* (2013.01)

(58) Field of Classification Search
USPC .......................................... 423/635, 636, 637
See application file for complete search history.

(56) References Cited

U.S. PATENT DOCUMENTS

| | | | |
|---|---|---|---|
| 4,977,024 A | 12/1990 | Morita et al. | |
| 5,106,608 A * | 4/1992 | Retschnig | C01F 5/02 423/155 |
| 6,506,828 B1 * | 1/2003 | Anabuki | C08K 3/22 106/18.26 |
| 2004/0219087 A1 * | 11/2004 | Mohri | C01B 13/14 423/263 |
| 2009/0148609 A1 * | 6/2009 | Lim | B82Y 30/00 427/380 |
| 2011/0014469 A1 * | 1/2011 | Nakagawa | C01F 5/02 428/402 |
| 2011/0300192 A1 * | 12/2011 | Kitajima | A61K 33/06 424/400 |
| 2012/0189850 A1 * | 7/2012 | Ohsaki | C01F 5/08 428/402 |
| 2012/0298912 A1 | 11/2012 | Ono | |
| 2013/0040799 A1 * | 2/2013 | Schrems | C01F 5/20 501/1 |
| 2015/0210558 A1 * | 7/2015 | Dickinson | C01F 5/04 423/600 |
| 2015/0366056 A1 * | 12/2015 | Matsuda | H05K 1/0373 174/250 |
| 2016/0053073 A1 * | 2/2016 | Matsui | C01F 5/02 523/200 |

FOREIGN PATENT DOCUMENTS

| | | |
|---|---|---|
| JP | 63-315515 | 12/1988 |
| JP | 2007-022902 | 2/2007 |
| JP | 2009-007215 | 1/2009 |
| JP | 2011-020870 | 2/2011 |
| JP | 2011-021069 | 2/2011 |
| WO | 2011/040593 | 4/2011 |
| WO | 2011/099378 | 8/2011 |

* cited by examiner

MAGNESIUM OXIDE PARTICLES, MAGNESIUM OXIDE PARTICLE PRODUCTION METHOD, RESIN COMPOSITION AND MOLDED BODY USING SUCH RESIN COMPOSITION, AND ADHESIVE OR GREASE

TECHNICAL FIELD

The present invention relates to magnesium oxide particles, a method for producing magnesium oxide particles, a resin composition and a molded body obtained from the resin composition, and an adhesive or grease.

BACKGROUND ART

Magnesium oxide particles, as being lightweight and having excellent properties of heat resistance, heat conductivity, and electric insulation, are useful as a heat-resistant material or heat-dissipating filler. In particular, the particles have excellent properties as heat-dissipating filler which, when added to resin or the like, improves the heat conductivity of the resin product. Hence, the particles are used as filler for a molded body, an adhesive, grease or the like.

Such a molding body, an adhesive, grease, or the like, each containing magnesium oxide, is used as, for example, a printed circuit board on which electronic components (e.g. semiconductor element) are to be mounted, an electronic component, an adhesive for producing an electronic device (e.g. printed circuit board on which electronic components are mounted), or grease to be applied to an electronic component for improvement of heat dissipation of the electronic component.

Components containing magnesium oxide with high heat conductivity, such as an electronic component and a printed circuit board, exhibit improved heat dissipation. Magnesium oxide can prevent an excessive increase in the temperature of electronic components when heat is generated by the electronic components, and can prevent malfunction of the electronic components or deterioration of the resin used for the electronic components.

Patent Literature 1 discloses production of such magnesium oxide particles in order to provide high filling for a resin and to increase the heat dissipation. Here, magnesium oxide whose primary particles are spherical is produced by preparing magnesium hydroxide containing acetate in a predetermined proportion, and calcining the magnesium hydroxide at a predetermined temperature.

Patent Literature 2 teaches magnesium oxide that exhibits a ratio (median diameter)/(specific surface diameter calculated from specific surface area) of 3 or less, a ratio D90/D10 of 4 or less, a sharp particle size distribution, and a controlled degree of aggregation. Patent Literature 3 discloses use of magnesium oxide as filler for a resin composition or grease, for example.

CITATION LIST

Patent Literature

Patent Literature 1: JP 2009-7215 A
Patent Literature 2: JP 2011-20870 A
Patent Literature 3: JP 2011-21069 A

SUMMARY OF INVENTION

Technical Problem

However, the high integration of electronic components in recent years has caused problems in electronic components formed using a molded body, an adhesive, grease, and the like, such as soft errors in the memory and errors in control of the electronic components due to α rays emitted by α-ray-emitting substances contained in magnesium oxide.

The present invention has been made to solve the above problems, and aims to provide magnesium oxide particles that have high heat conductivity, excellent properties as heat-dissipating filler, and a low α dose to prevent problems such as soft errors in the memory; and a method for producing the magnesium oxide particles.

The present invention also aims to provide a resin composition that is formed using the magnesium oxide particles, has excellent properties as heat-dissipating filler, and can prevent problems such as soft errors in the memory; a molded body or an adhesive formed using the resin composition; and grease containing the magnesium oxide particles.

Solution to Problem

That is, the present invention relates to magnesium oxide particles having a BET specific surface area of 0.1 to 17 $m^2/g$, and an α dose of 0.005 $c/cm^2 \cdot Hr$ or lower, the particles exhibiting a relation between an X-ray diffraction peak intensity y (cps) at a Bragg angle (2θ) of 42.80° to 43.00° and the BET specific surface area x ($m^2/g$) as represented by the following inequality (1):

$$y \geq -960x + 33000 \qquad (1).$$

Preferably, the magnesium oxide particles of the present invention exhibit a relation between a peak intensity y (cps) at a Bragg angle (2θ) of 42.80° to 43.00° and the BET specific surface area x ($m^2/g$) as represented by the following inequality (2):

$$y \geq -1500x + 55000 \qquad (2).$$

Preferably, in the magnesium oxide particles of the present invention, the BET specific surface area is 0.1 to 5 $m^2/g$.

The present invention relates to a method for producing magnesium oxide particles including: step 1 of adding a titanium compound mainly containing hydrous titanium oxide into an aqueous solution of a magnesium compound to adsorb an α-ray-emitting substance on the titanium compound; step 2 of filtering the aqueous solution containing the titanium compound from step 1 to separate and remove the titanium compound with the α-ray-emitting substance adsorbed thereon; step 3 of adding an alkali metal hydroxide and/or an alkali metal carbonate into the aqueous solution from step 2; and step 4 of separating by filtration a precipitated compound resulting from the addition of an alkali metal hydroxide and/or an alkali metal carbonate, and calcining the precipitated compound.

Preferably, in the production method of the present invention, the titanium compound shows a weight loss of 16% by mass or less when heated at 400° C., has a BET specific surface area of 150 to 250 $m^2/g$, and exhibits a ratio of an X-ray diffraction peak intensity (cps) at a Bragg angle (2θ) of 25.20° to 25.60° to the minimum intensity (cps) of the background of 10 to 50.

Preferably, in production method of the present invention, the aqueous solution in step 1 has a pH of 6 to 7.

Preferably, in the production method of the present invention, a calcining temperature in step 4 is 900° C. to 1500° C.

Preferably, in the production method of the present invention, the alkali metal carbonate is sodium carbonate.

The present invention also relates to a resin composition, containing the above magnesium oxide particles.

Preferably, in the resin composition of the present invention, the resin contained in the resin composition is an epoxy resin.

The present invention also relates to a molded body or an adhesive, formed from the above resin composition. The present invention further relates to grease, containing the above magnesium oxide particles.

Advantageous Effects of Invention

The magnesium oxide particles of the present invention are to be used as filler for a molded body, an adhesive, grease, or the like. Since the particles have an α dose of 0.005 c/cm$^2$·Hr or lower which is low, in an electronic component including such a molded body, an adhesive, grease, or the like or in an electronic device with the electronic component mounted thereon, the particles can prevent soft errors in the memory due to the α rays and errors in control of such an electronic component.

Also, the magnesium oxide has a BET specific surface area of 0.1 to 17 m$^2$/g, exhibits a relation between the peak intensity y at a predetermined Bragg angle and the BET specific surface area x as represented by inequality (1), has excellent crystallinity, and has high heat conductivity. Hence, an electronic component including a molded body, an adhesive, grease, or the like containing the magnesium oxide particles and an electronic device with such an electronic component mounted thereon exhibit excellent heat dissipation.

Since the method for producing magnesium oxide particles of the present invention includes the step of adsorbing α-ray-emitting substances on a titanium compound containing hydrous titanium oxide, and filtering the titanium compound containing the hydrous titanium oxide, magnesium oxide particles having an α dose of 0.005 c/cm$^2$·Hr or lower can be relatively easily obtained. The obtained magnesium oxide particles have a low α dose, high heat conductivity, and excellent heat dissipation, and are therefore useful as heat-dissipating filler.

The resin composition of the present invention, containing the magnesium oxide particles having excellent heat conductivity, has high heat conductivity, excellent heat dissipation, and a low α dose.

Also, the molded body and the adhesive of the present invention are each formed using a resin composition having excellent heat conductivity, and the grease of the present invention also contains the magnesium oxide particles having excellent heat conductivity. Hence, the molded body, adhesive, and grease each have high heat conductivity, excellent heat dissipation, and a low α dose.

DESCRIPTION OF EMBODIMENTS

Figure 1:
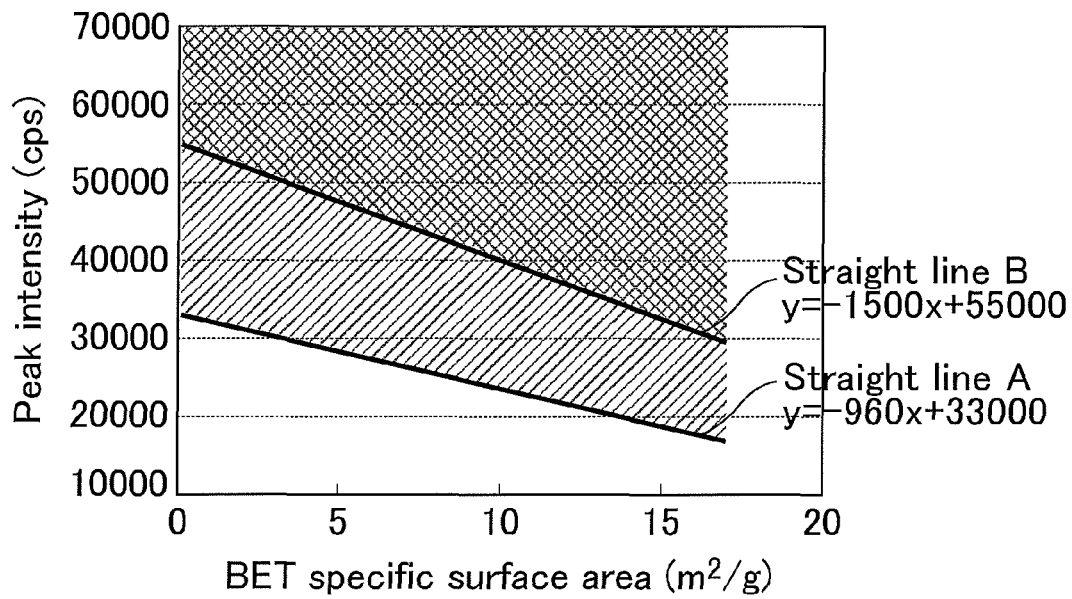
FIG. 1 is a graph showing the relation between the X-ray diffraction peak intensities y (cps) and the BET specific surface areas x (m$^2$/g) as represented by the inequalities (1) and (2) in the present invention.

Hereinafter, the magnesium oxide particles of the present invention and a method for producing magnesium oxide particles are described.

Magnesium oxide particles of the present invention have a BET specific surface area of 0.1 to 17 m$^2$/g, and an α dose of 0.005 c/cm$^2$·Hr or lower, the particles exhibiting a relation between an X-ray diffraction peak intensity y (cps) at a Bragg angle (2θ) of 42.80° to 43.00° and the BET specific surface area x (m$^2$/g) as represented by the following inequality (1):

$$y \geq -960x + 33000 \tag{1}$$

The magnesium oxide particles of the present invention have an α dose of 0.005 c/cm$^2$·Hr or lower.

If magnesium oxide particles have an α dose of higher than 0.005 c/cm$^2$·Hr, use of a molded body such as a printed circuit board containing the magnesium oxide particles and the like may cause problems such as soft errors in the flash memory as an electronic component mounted on the board and control errors in electronic components.

These errors such as soft errors are considered to be due to the α-ray-emitting substances such as U and Th in the resin, and these α-ray-emitting substances are considered to be mainly contained in filler such as magnesium oxide particles. For this reason, α-ray-emitting substances (e.g. U, Th) in the magnesium oxide particles need to be removed. In this respect, the magnesium oxide particles of the present invention have been subjected to a treatment of removing the α-ray-emitting substances, and thus have an α dose of 0.005 c/cm$^2$·Hr or lower. Hence, the magnesium oxide particles, when used in production of a product such as a printed circuit board, reduce occurrence of soft errors in a flash memory and the like.

The α dose of the magnesium oxide particles is preferably 0.003 c/cm$^2$·Hr or lower.

The magnesium oxide particles of the present invention have a BET specific surface area of 0.1 to 17 m$^2$/g, the particles exhibiting a relation between an X-ray diffraction peak intensity y (cps) at a Bragg angle (2θ) of 42.80° to 43.00° and the BET specific surface area x (m$^2$/g) as represented by the following inequality (1):

$$y \geq -960x + 33000 \tag{1}$$

Since the BET specific surface area of the magnesium oxide particles of the present invention is 0.1 to 17 m$^2$/g, the X-ray diffraction peak intensity y (cps) at a Bragg angle (2θ) of 42.80° to 43.00° from the inequality (1) in the case of a BET specific surface area of 0.1 m$^2$/g is 32904 cps or higher, and the X-ray diffraction peak intensity y (cps) in the case of a BET specific surface area of 17 m$^2$/g under the above conditions is 16680 cps or higher.

Here, the X-ray diffraction peak intensity y (cps) in the case of a BET specific surface area of 5 m$^2$/g under the above conditions is 28200 cps or higher. The X-ray diffraction peak intensity y (cps) in the case of a BET specific surface area of 10 m$^2$/g under the above conditions is 23400 cps or higher. The X-ray diffraction peak intensity y (cps) in the case of a BET specific surface area of 15 m$^2$/g under the above conditions is 18600 cps or higher.

The specific surface area refers to a surface area per unit mass of a certain object. The BET specific surface area refers to a specific surface area obtained by the BET method which is one of the methods for measuring a specific surface area. The BET method is a gas adsorption method of adsorbing gaseous particles such as nitrogen (N$_2$) on solid particles, and measuring the surface area from the amount of the gaseous particles adsorbed. Specifically, a specific surface area is determined by calculating the molar volume of the adsorbate VM by the BET method from the relation between the pressure P and the adsorption volume V.

FIG. 1 is a graph showing the relation between the X-ray diffraction peak intensities y (cps) and the BET specific surface areas x (m²/g) as represented by the inequalities (1) and (2) in the present invention.

In FIG. 1, the straight line A is represented by the following equation (3), and the X-ray diffraction peak intensity y (cps) represented by inequality (1) is somewhere in the upper region from the straight line A including the straight line A in the range of the BET specific surface area x of 0.1 to 17 m²/g.

$$y \geq -960x + 33000 \quad (3).$$

(wherein $0.1 \leq x \leq 17$)

One of the properties required for the magnesium oxide particles to be added to the resin composition is the BET specific surface area. In a predetermined range of the specific surface area, a certain relation is observed between the crystallinity and the specific surface area of the magnesium oxide particles, and the crystallinity of magnesium oxide particles in the present invention is defined in view of the relation. That is, although the crystallinity decreases as the specific surface area increases, the peak intensity of the magnesium oxide particles of the present invention is somewhere in the upper region from the equation (3) including the equation (3) (the region defined by the inequality (1)), which means that the magnesium oxide particles have high crystallinity.

If the X-ray diffraction peak intensity y (cps) is lower than the region defined by the inequality (1), the crystallinity is low and thus the heat conductivity is low, so that the heat dissipation of the resin composition containing the magnesium oxide is low.

The magnesium oxide particles exhibiting the relation represented by the inequality (1) have a high X-ray diffraction peak intensity in the range of the BET specific surface area of 0.1 to 17 m²/g as shown in FIG. 1, and thus have high crystallinity. The particles therefore have high heat conductivity, and are suited as heat-dissipating filler. Here, the X-ray diffraction peak intensity y (cps) is usually about 100000 cps or lower.

The particles preferably exhibit a relation between a peak intensity y (cps) at a Bragg angle (2θ) of 42.80° to 43.00° and the BET specific surface area x (m²/g) as represented by the following inequality (2):

$$y \geq -1500x + 55000 \quad (2).$$

The X-ray diffraction peak intensity y (cps) at a Bragg angle (2θ) of 42.80° to 43.00° from the inequality (2) in the case of a BET specific surface area of 0.1 m²/g is 54850 cps or higher. The X-ray diffraction peak intensity y (cps) in the case of a BET specific surface area of 17 m²/g under the above conditions is 29500 cps or higher.

Here, the X-ray diffraction peak intensity y (cps) in the case of a BET specific surface area of 5 m²/g under the above conditions is 47500 cps or higher. The X-ray diffraction peak intensity y (cps) in the case of a BET specific surface area of 10 m²/g under the above conditions is 40000 cps or higher. The X-ray diffraction peak intensity y (cps) in the case of a BET specific surface area of 15 m²/g under the above conditions is 32500 cps or higher.

In FIG. 1, the relation between the X-ray diffraction peak intensity y (cps) and the BET specific surface area x (m²/g) as represented by inequality (2) is somewhere in the upper region from the straight line B including the straight line B. The straight line B is represented by the following equation (4). Also in this case, the X-ray diffraction peak intensity y (cps) is usually about 100000 cps or lower.

$$y = -1500x + 55000 \quad (4).$$

(wherein $0.1 \leq x \leq 17$)

The magnesium oxide particles exhibiting the relation represented by the inequality (2) have a higher X-ray diffraction peak intensity in the range of the BET specific surface area of 0.1 to 17 m²/g as shown in FIG. 1, and thus have higher crystallinity. The particles therefore have high heat conductivity, and are optimal as heat-dissipating filler.

The BET specific surface area is preferably 0.1 to 5 m²/g. This is because magnesium oxide particles having such a specific surface area of 0.1 to 5 m²/g exhibit even higher crystallinity and higher heat conductivity than the magnesium oxide particles described above with a specific surface area out of this range.

A resin composition containing 86 wt % magnesium oxide particles exhibiting the relation represented by the inequality (1) in an ethylene ethyl acrylate (EEA) copolymer resin has a heat conductivity of 1.2 to 3.5 W/m·K. A resin composition containing 86 wt % magnesium oxide particles exhibiting the relation represented by the inequality (2) in an ethylene ethyl acrylate (EEA) copolymer resin has a heat conductivity of 2.1 to 3.5 W/m·K. A resin composition containing 86 wt % magnesium oxide exhibiting the relation represented by inequality (2) and having a BET specific surface area of 0.1 to 5 m²/g in an ethylene ethyl acrylate (EEA) copolymer resin has a high heat conductivity of 2.7 to 3.7 W/m·K.

A resin composition containing 83 wt % magnesium oxide particles exhibiting the relation represented by the inequality (1) in an epoxy resin has a heat conductivity of 1.0 to 3.5 W/m·K. A resin composition containing 83 wt % magnesium oxide particles exhibiting the relation represented by the inequality (2) in an epoxy resin has a heat conductivity of 2.0 to 3.5 W/m·K. A resin composition containing 83 wt % magnesium oxide exhibiting the relation represented by inequality (2) and having a BET specific surface area of 0.1 to 5 m²/g in an epoxy resin has a high heat conductivity of 2.5 to 3.5 W/m·K.

The above heat conductivity can be measured by the method in accordance with JIS A 1412-1 to JIS A 1412-3.

Preferably, the magnesium oxide particles having such properties have an average particle size of 0.1 to 12.0 μm, and have a purity of 99.5% by mass or higher.

Next, the method for producing magnesium oxide particles according to the present invention is described.

The method for producing magnesium oxide particles according to the present invention includes: step 1 of adding a titanium compound mainly containing hydrous titanium oxide into an aqueous solution of a magnesium compound to adsorb an α-ray-emitting substance on the titanium compound; step 2 of filtering the aqueous solution containing the titanium compound from step 1 to separate and remove the titanium compound with the α-ray-emitting substance adsorbed thereon; step 3 of adding an alkali metal hydroxide and/or an alkali metal carbonate into the aqueous solution from step 2; and step 4 of separating by filtration a precipitated compound resulting from the addition of an alkali metal hydroxide and/or an alkali metal carbonate, and calcining the precipitated compound.

In step 1 of the method for producing magnesium oxide particles according to the present invention, a titanium compound mainly containing hydrous titanium oxide is added into an aqueous solution of a magnesium compound, so that α-ray emitting substances are adsorbed on the titanium compound. Here, "an aqueous solution of a magnesium compound" means a solution obtained by dissolving a magnesium compound in water.

Examples of the magnesium compound include magnesium chloride, magnesium sulfate, magnesium nitrate, and magnesium acetate. Here, an aqueous solution is preferred, and the aqueous solution may contain an organic solvent such as an alcohol that can be blended with water. In the aqueous solution of a magnesium compound, the concentration of the magnesium compound is preferably 1 to 8 mol/L.

In the present invention, a titanium compound mainly containing hydrous titanium oxide is added to an aqueous solution of a magnesium compound.

The hydrous titanium oxide is also called metatitanic acid, and is generally produced by a method called a sulfuric acid method. This production method includes dissolving a compound such as titanium ore, ilmenite ($FeTiO_3$), and natural rutile ($TiO_2$) in concentrated sulfuric acid by heating to obtain a solution of titanium sulfate ($Ti(SO_4)_2$), and hydrolyzing the solution by heating, thereby obtaining particulate hydrous titanium oxide. It is difficult to obtain pure hydrous titanium oxide, and usually, byproducts such as titanium oxide and titanium hydroxide are generated. The production method is not limited to the above method.

Preferably, the titanium compound shows a weight loss of 16% by mass or less when heated at 400° C., has a BET specific surface area of 150 to 250 $m^2/g$, and exhibits a ratio of an X-ray diffraction peak intensity (cps) at a Bragg angle (2θ) of 25.20° to 25.60° to the minimum intensity (cps) of the background of 10 to 50.

A titanium compound containing hydrous titanium hydroxide having the above properties favorably adsorbs α-ray-emitting substances when added into an aqueous solution of a magnesium compound and the resulting mixture is stirred. Accordingly, the α ray emitting substances can be favorably removed.

The titanium compound may contain, as well as hydrous titanium oxide, titanium oxide and titanium hydroxide as long as they do not reduce the adsorptivity.

A titanium compound having a BET specific surface area of smaller than 150 $m^2/g$ cannot sufficiently adsorb U and Th because of the excessively small specific surface area. A titanium compound having a BET specific surface area of larger than 250 $m^2/g$ is in the form of very small particles because of the excessively large specific surface area, and is therefore difficult to separate from the aqueous solution of a magnesium compound.

Also, in the case that the ratio of the X-ray diffraction peak intensity (cps) at a Bragg angle (2θ) of 25.20° to 25.60° to the minimum peak (cps) of the background is less than 10, which means that the crystallinity is low, it is difficult to separate the titanium compound and the aqueous solution of a magnesium compound. In the case that the ratio of the peak intensity (cps) to the minimum peak (cps) of the background is more than 50, which means that the specific surface area is excessively small, the titanium compound cannot sufficiently adsorb α-ray-emitting substances such as U and Th.

The pH at this time is preferably 6 to 7, and an acidic or alkaline compound or an aqueous solution thereof may be added to adjust the pH to a value in this range.

A pH of less than 6 is not preferred because the titanium compound cannot sufficiently adsorb α-ray-emitting substances. A pH of more than 7 is not preferred because magnesium hydroxide easily precipitates.

After the titanium compound is added, the mixture is stirred such that the α-ray-emitting substances such as U and Th contained in the mixture are adsorbed on the titanium compound. The temperature of the mixture at this time is preferably 15° C. to 35° C., and the stirring time is preferably 15 to 30 hours.

A stirring time of shorter than 15 hours may not allow sufficient adsorption of α-ray-emitting substances such as U and Th, while a stirring time of longer than 30 hours may be economically disadvantageous because the adsorption amount of α-ray-emitting substances such as U and Th does not increase much.

In step 1, the magnesium compound is dissolved, such that the α-ray-emitting substances (e.g. U, Th) contained in the magnesium compound are sufficiently adsorbed on the titanium compound. Thereafter, in step 2, the aqueous solution containing the titanium compound is filtered such that the titanium compound having the α-ray-emitting substances adsorbed thereon is separated and removed.

Separating the compound by filtration produces an aqueous solution containing a magnesium compound from which α-ray-emitting substances such as U and Th are removed.

The filtration step leaves a cake containing the titanium compound and α-ray-emitting substances such as U and Th. To this cake is added an aqueous solution containing an acid such as hydrochloric acid is added, so that a mixture is obtained. The mixture is filtered again to separate substances such as U and Th adsorbed on the titanium compound, and the resulting titanium compound is washed with water, whereby the titanium compound is renewed. The renewed titanium compound can be used to adsorb the α-ray-emitting substances in step 1 again.

In step 3, an alkali metal hydroxide and/or an alkali metal carbonate is/are added into the aqueous solution containing a magnesium compound from step 2 and reacted.

When an alkali metal hydroxide is added, magnesium hydroxide precipitates. When an alkali metal carbonate is added, basic magnesium carbonate precipitates.

Hereinafter, the case of precipitating basic magnesium carbonate and the case of precipitating magnesium hydroxide are described separately.

First, the case of precipitating basic magnesium carbonate by the above reaction is described.

Examples of the alkali metal carbonate to be used here include sodium carbonate and potassium carbonate. Here, sodium carbonate is preferred.

In step 3, an alkali metal carbonate as it is or as an aqueous solution of the alkali metal carbonate is added to the aqueous solution from step 2.

Here, the concentration of the alkali metal carbonate in the aqueous solution is preferably 1 to 5 mol/L.

In order to obtain magnesium oxide having excellent crystallinity, the temperature at the time of the addition is preferably 15° C. to 35° C.

Next, in step 4, the basic magnesium carbonate precipitated upon the addition of the alkali metal carbonate is separated by filtering, and is then calcined.

Specifically, the precipitated basic magnesium carbonate is filtered, washed with water until the filtrate has an electrical conductivity of 100 μs/cm or lower, for example, to remove an alkali metal compound (byproduct), and then dried at 100° C. to 150° C. The drying may be carried out by spray drying.

Also, magnesium oxide particles may be obtained by adding water (e.g. pure water) to the basic magnesium carbonate to give a slurry, adding an aqueous magnesium chloride solution to the slurry to give a mixed slurry containing magnesium chloride, drying the mixed slurry containing magnesium chloride by a drying method such as spray drying, and calcining the dried product at 900° C. to 1500° C. for 1 to 10 hours.

A calcining temperature of lower than 900° C. is not preferred because it may not allow the basic magnesium carbonate to be completely converted into magnesium oxide, while a calcining temperature of higher than 1500° C. is not preferred because it may sinter the particles to form larger particles.

The magnesium chloride serves as a particle growth auxiliary agent for magnesium oxide in calcining.

The spray drying can be carried out with a known device by a known method.

If the magnesium chloride in the aqueous magnesium chloride solution to be added contains α-ray-emitting substances, generation of α rays cannot be reduced. Hence, the magnesium chloride to be added may also be treated with a titanium compound mainly containing hydrous titanium oxide, so that α-ray-emitting substances are removed.

Then, the calcined magnesium oxide particles are washed with an alcohol or pure water to remove impurities, are filtered and dried, so that magnesium oxide particles can be obtained.

The dried magnesium oxide particles may be ground with an air mill or the like device to control the particle size, if necessary.

The obtained magnesium oxide particles preferably have a BET specific surface area of 0.1 to 17 m$^2$/g, and an α dose of 0.005 c/cm$^2$·Hr or lower, the particles exhibiting a relation between a peak intensity y (cps) at a Bragg angle (2θ) of 42.80° to 43.00° and the BET specific surface area x (m$^2$/g) as represented by the following inequality (2):

$$y \geq -1500x+55000 \qquad (2).$$

The magnesium oxide particles also preferably have an average particle size of 0.1 to 12.0 μm.

Next, the case of precipitating magnesium hydroxide by the above reaction is described.

Examples of the alkali metal hydroxide to be used include sodium hydroxide and potassium hydroxide.

In step 3, an alkali metal hydroxide as it is or as an aqueous solution of the alkali metal hydroxide is added to the aqueous solution from step 2.

Here, the concentration of the alkali metal hydroxide in the aqueous solution is preferably 15 to 25 mol/L.

In order to obtain magnesium oxide having excellent crystallinity, the temperature at the time of the addition is preferably 15° C. to 35° C.

Next, the magnesium hydroxide precipitated upon the addition of the alkali metal hydroxide is separated by filtering, and is then calcined.

Specifically, the precipitated magnesium hydroxide is filtered, washed with water until the filtrate has an electrical conductivity of 100 μs/cm or lower, for example, to remove an alkali metal compound (byproduct), and then dried at 100° C. to 150° C. The drying may be carried out by spray drying.

Also, magnesium oxide particles may be obtained by adding water (e.g. pure water) to the magnesium hydroxide to give a slurry, adding an aqueous magnesium chloride solution to the slurry to give a mixed slurry containing magnesium chloride, drying the mixed slurry containing magnesium chloride by a drying method such as spray drying, and calcining the dried product at 900° C. to 1500° C. for 1 to 10 hours.

A calcining temperature of lower than 900° C. is not preferred because it may not allow the magnesium hydroxide to be completely converted into magnesium oxide, while a calcining temperature of higher than 1500° C. is not preferred because it may sinter the particles to form larger particles.

The magnesium chloride serves as a particle growth auxiliary agent for magnesium oxide in calcining.

The spray drying can be carried out with a known device by a known method.

The magnesium chloride to be added may be subjected to a treatment of removing α-ray-emitting substances as in the case of producing basic magnesium carbonate powder.

The washing method and the grinding method for the obtained magnesium oxide particles are the same as in the case of the reaction using an alkali metal carbonate.

The obtained magnesium oxide particles preferably have a BET specific surface area of 0.1 to 17 m$^2$/g, and an α dose of 0.005 c/cm$^2$·Hr or lower, the particles exhibiting a relation between an X-ray diffraction peak intensity y (cps) at a Bragg angle (2θ) of 42.80° to 43.00° and the BET specific surface area x (m$^2$/g) as represented by the following inequality (1):

$$y \geq -960x+33000 \qquad (1).$$

The magnesium oxide particles preferably have an average particle size of 0.1 to 12.0 μm.

In step 3 in the present invention, both of the alkali metal hydroxide and the alkali metal carbonate may be added. In this case, both magnesium hydroxide and basic magnesium carbonate precipitate, and both of them are converted into magnesium oxide when calcined.

The magnesium oxide of the present invention, when added to a resin, is formed into a resin composition having excellent heat dissipation and excellent heat conductivity.

In this case, the resin to be used may be a thermoplastic resin or a thermosetting resin. Examples thereof include epoxy resins, phenolic resins, polyphenylene sulfide (PPS) resins, polyester-based resins, polyamides, polyimides, polystyrene, polyethylenes, polypropylenes, polyvinyl chlorides, polyvinylidene chlorides, fluororesins, polymethyl methacrylates, ethylene-ethyl acrylate copolymer (EEA) resins, polycarbonates, polyurethanes, polyacetals, polyphenylene ethers, polyetherimides, acrylonitrile-butadiene-styrene copolymer (ABS) resins, liquid crystal resins (LCP), silicone resins, and acrylic resins.

The resin composition containing magnesium oxide of the present invention herein is used as a molded body or an adhesive. The magnesium oxide of the present invention is also used for grease. The molded body, adhesive, and grease each are also one aspect of the present invention.

The resin used for the molded body of the present invention may be any of the resins of the above kinds, and the molded body formed from the resin contains magnesium oxide of the present invention. The amount of the magnesium oxide in the molded body is preferably 10 to 90 wt %.

The molded body containing the magnesium oxide can be obtained by mixing the powder of the above resin and magnesium oxide, and molding the mixture by any of various molding methods.

The magnesium oxide of the present invention, together with other components, can also be formed into a resin composition. Examples of the other components to be used together include metal oxides (e.g. zinc oxide, titanium oxide, aluminum oxide), heat-dissipating fillers (e.g. magnesium carbonate, aluminum nitride, boron nitride, silicon nitride, titanium nitride, metal silicon, diamond) other than the magnesium oxide, and surfactants.

The molded body of the present invention is suitable as any of various vehicle components, printed circuit boards, and electric and electronic components such as heat sinks. Also, the molded body is suitable as a container for housing various electric/electronic elements and electric/electronic devices.

Since these molded bodies have excellent heat dissipation, even when heat is generated by components such as electronic components, the molded bodies can properly dissipate the heat to prevent the temperatures of the electronic components and electronic devices from increasing excessively high.

Examples of the adhesive used in the present invention include phenolic resin-based adhesives, α-olefin resin adhesives, vinyl acetate resin emulsion adhesives, epoxy resin-based adhesives, polyurethane adhesives, acrylic resin-based adhesives, chloroprene rubber-based adhesives, nitrile rubber-based adhesives, SBR-based adhesives, and natural rubber-based adhesives.

The adhesive of the present invention is suitable as an adhesive for various vehicle components, printed circuit boards, and electric/electronic components such as heat sinks.

The amount of the magnesium oxide in the adhesive of the present invention can be determined according to the desired heat conductivity of the adhesive. In order for the magnesium oxide to exhibit its heat dissipation sufficiently, the amount of the magnesium oxide is preferably 10 to 90 wt % of the total amount of the adhesive.

Adding the magnesium oxide of the present invention to any of these adhesives provides an adhesive having excellent heat dissipation. In electronic components, electronic devices, and the like formed using such an adhesive, even when heat is generated by the electronic components or the like, the adhesive can conduct the heat efficiently from the heat-generating elements to heat-dissipating elements or metals, thereby preventing an excessive increase in the temperatures of the electronic components and electronic devices.

The amount of magnesium oxide in the grease of the present invention can be determined according to the desired heat conductivity. In order for the magnesium oxide to exhibit its heat dissipation sufficiently, the amount of the magnesium oxide is preferably 10 to 90 vol % of the total amount of the grease.

The magnesium oxide of the present invention, together with other components, can be formed into grease. Examples of the other components include metal oxides (zinc oxide, titanium oxide, aluminum oxide), heat-dissipating fillers (e.g. magnesium carbonate, aluminum nitride, boron nitride, silicon nitride, titanium nitride, metal silicon, diamond) other than the magnesium oxide, and surfactants.

The base oil for the grease may be one of or any combination of various oil materials such as mineral oil, synthetic oil, silicone oil, and fluorine-based hydrocarbon oil. Particularly preferred synthetic oil is hydrocarbon oil. The synthetic oil may be α-olefin, diester, polyol ester, trimellitic acid ester, polyphenyl ether, or alkylphenyl ether.

The grease of the present invention may contain a surfactant if necessary. The surfactant is preferably a nonionic surfactant. A nonionic surfactant can contribute to higher heat conductivity and appropriate control of the consistency.

Examples of the nonionic surfactant include polyoxyethylene alkyl ethers, polyoxyethylene alkyl phenyl ethers, polyoxyethylene alkyl naphthyl ethers, polyoxyethylated castor oil, polyoxyethylene hydrogenated castor oil, polyoxyethylene alkylamides, polyoxyethylene-polyoxypropylene glycol, polyoxyethylene-polyoxypropylene glycol ethylenediamine, decaglycerol fatty acid ester, polyoxyethylene monofatty acid ester, polyoxyethylene difatty acid ester, polyoxyethylene propylene glycol fatty acid ester, polyoxyethylene sorbitan monofatty acid ester, polyoxyethylene sorbitan trifatty acid ester, ethylene glycol monofatty acid ester, diethylene glycol monofatty acid ester, propylene glycol monofatty acid ester, glycerol monofatty acid ester, pentaerythritol monofatty acid ester, sorbitan monofatty acid ester, sorbitan sesquifatty acid ester, and sorbitan trifatty acid ester.

The grease of the present invention is used by being applied to a heat-generating element or a heat-dissipating element. Examples of the heat-generating element include heat-generating electronic components such as general power sources; electronic devices (e.g. power source power transistors, power modules, thermistors, thermocouples, temperature sensors); and integrated circuit elements (e.g. LSIs, CPUs). Examples of the heat-dissipating element include heat-dissipating components such as heat spreaders and heat sinks; heat pipes, and heat-dissipating plates. The grease may be applied by screen printing, for example. The screen printing can be performed using, for example, a metal mask or a screen mesh. Applying the grease of the present invention between a heat-generating element and a heat-dissipating element enables efficient conduction of heat from the heat-generating element to the heat-dissipating element, thereby effectively removing heat from the heat-generating element.

EXAMPLES

Hereinafter, examples of the present invention are described, but these examples are not intended to limit the scope of the present invention.

Example 1

[Step of Removing α-Ray-Emitting Substance from Aqueous Magnesium Chloride Solution]

In a 3-L beaker, 1000 mL of a 396 g/L aqueous solution of magnesium chloride (extra-pure reagent from Wako Pure Chemical Industries, Ltd.), 570 mL of a 200 g/L slurry of titanium compound mainly containing hydrous titanium oxide (from Sakai Chemical Industry Co., Ltd.), and 500 mL of pure water were mixed by stirring. To the mixture was added an aqueous solution of sodium hydroxide (extra-pure reagent from Wako Pure Chemical Industries, Ltd.) to control the pH to 6 to 7. The mixture was stirred at 25° C. for 24 hours, and then filtered so that an aqueous magnesium chloride solution (filtrate) from which the titanium compound mainly containing hydrous titanium hydroxide and α-ray-emitting substances were removed was obtained.

Here, the titanium compound mainly containing hydrous titanium oxide showed a weight loss of 14.0% by mass when heated at 400° C., had a BET specific surface area of 224 $m^2$/g, and exhibited a ratio of an X-ray diffraction peak intensity (cps) at a Bragg angle (2θ) of 25.20° to 25.60° to the minimum intensity (cps) of the background of 19.3.

[Step of Neutralizing Aqueous Magnesium Chloride Solution from which α-Ray-Emitting Substance was Removed, to Produce Basic Magnesium Carbonate]

While the filtrate (aqueous magnesium chloride solution from which α-ray-emitting substances were removed) was stirred, 1000 mL of a 135 g/L aqueous solution of sodium carbonate (extra-pure reagent from Wako Pure Chemical Industries, Ltd.) was added at a rate of 16.67 mL/min over 1 hour, so that a precipitate of basic magnesium carbonate was formed. The precipitate of basic magnesium carbonate was filtered, washed with water until the filtrate had an electrical conductivity of 100 μs/cm or lower, and dried at 130° C. for 2 hours, whereby white powder was obtained.

The white powder, when analyzed by an ICP optical emission spectrometry (SPS 3100-24HV from SII Nano-Technology Inc.), showed an Mg content of 20.2 wt % and an X-ray diffraction pattern with a main peak attributed to basic magnesium carbonate ($Mg_5(CO_3)_4(OH)_2(H_2O)_4$).

[Step of Calcining Basic Magnesium Carbonate to Produce Magnesium Oxide]

White powder mainly containing the basic magnesium carbonate obtained above was calcined at 1000° C., so that white powder was obtained. The white powder, when analyzed by an ICP optical emission spectrometry, showed an MgO purity of 99.9 wt %, an X-ray diffraction pattern with a main peak attributed to magnesium oxide, a peak intensity at $2\theta=42.886°$ C. of 35004 cps, a BET specific surface area of 15.2 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of ethylene-ethylacrylate copolymer (EEA) resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape (a cylinder shape) with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 2.41 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon (registered trademark) stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 2.2 W/mK.

The measurements of the BET specific surface area, X-ray diffraction, and α dose were performed by the following methods. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Measurement Methods of Various Physical Properties
[Measurement of BET Specific Surface Area]

The BET specific surface area was determined by GEMINI VII2390 from Micromeritics Instrument Corporation using a sample treated at 200° C. for 40 minutes in nitrogen atmosphere.

[Measurement of X-Ray Diffraction]

The X-ray diffraction was measured with an X-ray diffractometer RINT-TTRIII (Rigaku Corporation) of which the X-ray source was set to CuKα rays, the voltage was set to 50 kV, and the current was set to 300 mA, under the conditions of: sample rotational speed=90.000 rpm, divergence slit=1.00 mm, divergence vertical limiting slit=10 mm, divergence slit=open, receiving slit=open, scanning mode=FT, counting time=0.5 seconds, step width=0.0400°, scanning axis=2θ/θ, scanning range=10.0000 to 70.0000°, θ offset=0.0000°, and total number of times=1.

[Measurement of α Dose]

Using a low-level α-ray measuring apparatus LACS-4000M from Sumika Chemical Analysis Service, Ltd., the α dose was measured under the conditions of: applied voltage=1.90 kV, counting gas=PR-10 gas (Ar: 90%, $CH_4$: 10%) 100 mL/min, sample area=1000 cm$^2$, total counting time=99 hours, and counting efficiency=80%.

Example 2

[Step of Calcining Basic Magnesium Carbonate to Produce Magnesium Oxide]

By the same procedure as that in Example 1, basic magnesium carbonate was produced, and white powder mainly containing the basic magnesium carbonate obtained was calcined at 1100° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at $2\theta=42.888°$ of 55696 cps, a BET specific surface area of 3.61 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 2.68 W/mK.
[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 2.33 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 3

[Step of Calcining Basic Magnesium Carbonate to Produce Magnesium Oxide]

By the same procedure as that in Example 1, basic magnesium carbonate was produced, and white powder mainly containing the basic magnesium carbonate obtained was calcined at 1250° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.890° of 58294 cps, a BET specific surface area of 1.69 $m^2/g$, and an α dose of 0.001±0.001 $c/cm^2/h$.
[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 2.97 W/mK.
[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 2.64 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 4

[Step of Calcining Basic Magnesium Carbonate to Produce Magnesium Oxide]

By the same procedure as that in Example 1, basic magnesium carbonate was produced, and white powder mainly containing the basic magnesium carbonate obtained was calcined at 1400° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.889° of 60593 cps, a BET specific surface area of 0.92 $m^2/g$, and an α dose of 0.001±0.001 $c/cm^2/h$.
[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 3.05 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 2.8 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 5

While the filtrate (aqueous magnesium chloride solution from which α-ray-emitting substances were removed) obtained in Example 1 was stirred, 1000 mL of a 135 g/L aqueous solution of sodium carbonate (extra-pure reagent from Wako Pure Chemical Industries, Ltd.) was added at a rate of 16.67 mL/min over 1 hour, so that a precipitate of basic magnesium carbonate was formed. The precipitate of basic magnesium carbonate was filtered, washed with water until the filtrate had an electrical conductivity of 100 μs/cm or lower, and formed into a slurry again. To the slurry was added 10 mL of the filtrate (aqueous magnesium chloride solution from which α-ray-emitting substances were removed) obtained in Example 1. The mixture was stirred for 15 minutes, and dried at 130° C. for 2 hours, so that white powder was obtained. The white powder, when analyzed by an ICP optical emission spectrometry, showed an Mg content of 20.1 wt % and an X-ray diffraction pattern with a main peak attributed to basic magnesium carbonate $Mg_5(CO_3)_4(OH)_2(H_2O)_4$).

[Step of Calcining Basic Magnesium Carbonate to Produce Magnesium Oxide]

White powder mainly containing the basic magnesium carbonate obtained above was calcined at 1400° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at 2θ=42.892° of 62791 cps, a BET specific surface area of 0.18 $m^2$/g, and an α dose of 0.001±0.001 c/$cm^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 3.32 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 3.02 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 1

[Step of Neutralizing Aqueous Magnesium Chloride Solution to Produce Magnesium Carbonate]

While 1980 mL of a 200 g/L aqueous solution of magnesium chloride (extra-pure reagent from Wako Pure Chemical Industries, Ltd.) was stirred, 1000 mL of a 135 g/L aqueous solution of sodium carbonate (extra-pure reagent from Wako Pure Chemical Industries, Ltd.) was added at a rate of 16.67 mL/min over 1 hour, so that a precipitate of basic magnesium carbonate was formed. The precipitate was filtered, washed with water until the filtrate had an electrical conductivity of 100 μs/cm or lower, and dried at 130° C. for 2 hours, whereby white powder was obtained. The white powder, when analyzed by an ICP optical emission spectrometry, showed an Mg content of 20.2 wt % and an X-ray diffraction pattern with a main peak attributed to basic magnesium carbonate ($Mg_5(CO_3)_4(OH)_2(H_2O)_4$).

[Step of Calcining Basic Magnesium Carbonate to Produce Magnesium Oxide]

White powder mainly containing the basic magnesium carbonate obtained above was calcined at 1000° C., so that white powder was obtained. The white powder, when analyzed by an ICP optical emission spectrometry, showed an MgO purity of 99.9 wt %, an X-ray diffraction pattern with a main peak attributed to magnesium oxide, a peak intensity at $2\theta=42.887°$ of 30491 cps, a BET specific surface area of 14.5 m$^2$/g, and an α dose of 0.012±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.74 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.65 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 2

[Step of Calcining Basic Magnesium Carbonate to Produce Magnesium Oxide]

By the same procedure as that in Comparative Example 1, basic magnesium carbonate was produced, and white powder mainly containing the basic magnesium carbonate obtained was calcined at 1100° C., so that white powder was obtained. The white powder, when analyzed by an ICP optical emission spectrometry, showed an MgO purity of 99.8 wt %, an X-ray diffraction pattern with a main peak attributed to magnesium oxide, a peak intensity at $2\theta=42.889°$ of 39629 cps, a BET specific surface area of 3.71 m$^2$/g, and an α dose of 0.011±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.78 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.68 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 3

[Step of Calcining Basic Magnesium Carbonate to Produce Magnesium Oxide]

By the same procedure as that in Comparative Example 1, basic magnesium carbonate was produced, and white powder mainly containing the basic magnesium carbonate obtained was calcined at 1250° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.888° of 44394 cps, a BET specific surface area of 1.75 m$^2$/g, and an α dose of 0.012±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.90 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.84 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 4

[Step of Calcining Basic Magnesium Carbonate to Produce Magnesium Oxide]

By the same procedure as that in Comparative Example 1, basic magnesium carbonate was produced, and white powder mainly containing the basic magnesium carbonate obtained was calcined at 1400° C., so that white powder was obtained. The white powder, when analyzed by an ICP optical emission spectrometry, showed an MgO purity of 99.8 wt %, an X-ray diffraction pattern with a main peak attributed to magnesium oxide, a peak intensity at 2θ=42.891° of 48693 cps, a BET specific surface area of 0.95 m$^2$/g, and an α dose of 0.012±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.93 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.85 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 5

While 1980 mL of a 200 g/L aqueous solution of magnesium chloride (extra-pure reagent from Wako Pure Chemical Industries, Ltd.) was stirred, 1000 mL of a 135 g/L aqueous solution of sodium carbonate (extra-pure reagent from Wako Pure Chemical Industries, Ltd.) was added at a rate of 16.67 mL/min over 1 hour, so that a precipitate of basic magnesium carbonate was formed. The precipitate of basic magnesium carbonate was filtered, washed with water until the filtrate had an electrical conductivity of 100 μs/cm or lower, and formed into a slurry again. To the slurry was added 10 mL of the filtrate (aqueous magnesium chloride solution from which α-ray-emitting substances were removed) obtained in Example 1. The mixture was stirred for 15 minutes, and dried at 130° C. for 2 hours, so that white powder was obtained. The white powder, when analyzed by an ICP optical emission spectrometry, showed an Mg content of 20.3 wt % and an X-ray diffraction pattern with a main peak attributed to basic magnesium carbonate ($Mg_5(CO_3)_4(OH)_2(H_2O)_4$).

[Step of Calcining Basic Magnesium Carbonate to Produce Magnesium Oxide]

White powder mainly containing the basic magnesium carbonate obtained above was calcined at 1400° C., so that white powder was obtained. The white powder, when analyzed by an ICP optical emission spectrometry, showed an MgO purity of 99.8 wt %, an X-ray diffraction pattern with a main peak attributed to magnesium oxide, a peak intensity at 2θ=42.889° of 50998 cps, a BET specific surface area of 0.20 m²/g, and an α dose of 0.011±0.001 c/cm²/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 2.31 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 2.21 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 6

[Step of Neutralizing Aqueous Magnesium Chloride Solution from Which α-Ray-Emitting Substances Were Removed, to Produce Magnesium Hydroxide]

By the same procedure as that in Example 1, the step of removing α-ray-emitting substances from the aqueous magnesium chloride solution was carried out. While the filtrate (aqueous magnesium chloride solution from which α-ray-emitting substances were removed) obtained was stirred, 485 mL of a 725 g/L aqueous solution of sodium hydroxide was added at a rate of 8.08 mL/min over 1 hour, so that a precipitate of magnesium hydroxide was formed. The precipitate was filtered, washed with water until the filtrate had an electrical conductivity of 100 μs/cm or lower, and dried at 130° C. for 2 hours, whereby white powder was obtained. The white powder, when analyzed by an ICP optical emission spectrometry, showed an Mg content of 41.7 wt % and an X-ray diffraction pattern with a main peak attributed to magnesium hydroxide.

[Step of Calcining Magnesium Hydroxide to Produce Magnesium Oxide]

White powder mainly containing the magnesium hydroxide was calcined at 1000° C., so that white powder was obtained. The white powder, when analyzed by an ICP optical emission spectrometry, showed an MgO purity of 99.8 wt %, an X-ray diffraction pattern with a main peak attributed to magnesium oxide, a peak intensity at 2θ=42.885° of 22095 cps, a BET specific surface area of 13.2 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.36 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.29 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 7

[Step of Calcining Magnesium Hydroxide to Produce Magnesium Oxide]

By the same procedure as that in Example 6, magnesium hydroxide was produced, and white powder mainly containing the basic magnesium carbonate obtained was calcined at 1100° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at 2θ=42.887° of 29976 cps, a BET specific surface area of 3.59 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.39 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.33 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 8

[Step of Calcining Magnesium Hydroxide to Produce Magnesium Oxide]

By the same procedure as that in Example 6, magnesium hydroxide was produced, and white powder mainly containing the magnesium hydroxide obtained was calcined at 1250° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.886° of 34781 cps, a BET specific surface area of 1.73 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form,—put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.59 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.57 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 9

[Step of Calcining Magnesium Hydroxide to Produce Magnesium Oxide]

By the same procedure as that in Example 6, magnesium hydroxide was produced, and white powder mainly containing the magnesium hydroxide obtained was calcined at 1400° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at 2θ=42.889° of 36293 cps, a BET specific surface area of 0.81 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.61 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.58 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Example 10

While the filtrate (aqueous magnesium chloride solution from which α-ray-emitting substances were removed) obtained in Example 1 was stirred, 485 mL of a 725 g/L aqueous solution of sodium hydroxide (extra-pure reagent from Wako Pure Chemical Industries, Ltd.) was added at a rate of 8.08 mL/min over 1 hour, so that a precipitate of magnesium hydroxide was formed. The precipitate was filtered, washed with water until the filtrate had an electrical conductivity of 100 μs/cm or lower, and formed into a slurry again. To the slurry was added 10 mL of the filtrate (aqueous magnesium chloride solution from which α-ray-emitting substances were removed) obtained in Example 1. The mixture was stirred for 15 minutes, and dried at 130° C. for 2 hours, so that white powder was obtained. The white powder, when analyzed by an ICP optical emission spectrometry, showed an Mg content of 41.6 wt % and an X-ray diffraction pattern with a main peak attributed to magnesium hydroxide.

[Step of Calcining Magnesium Hydroxide to Produce Magnesium Oxide]

White powder mainly containing magnesium hydroxide was calcined at 1400° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at 2θ=42.889° of 37595 cps, a BET specific surface area of 0.17 m$^2$/g, and an α dose of 0.001±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.95 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.9 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 6

[Step of Neutralizing Aqueous Magnesium Chloride Solution to Produce Magnesium Hydroxide]

While 1980 mL of a 200 g/L aqueous solution of magnesium chloride (extra-pure reagent from Wako Pure Chemical Industries, Ltd.) was stirred, 485 mL of a 725 g/L aqueous solution of sodium hydroxide (extra-pure reagent from Wako Pure Chemical Industries, Ltd.) was added at a rate of 8.08 mL/min over 1 hour, so that a precipitate of magnesium hydroxide was formed. The precipitate was filtered, washed with water until the filtrate had an electrical conductivity of 100 μs/cm or lower, and dried at 130° C. for 2 hours, whereby white powder was obtained. The white powder, when analyzed by an ICP optical emission spectrometry, showed an Mg content of 41.7 wt %, and an X-ray diffraction pattern with a main peak attributed to magnesium hydroxide.

[Step of Calcining Magnesium Hydroxide to Produce Magnesium Oxide]

White powder mainly containing the magnesium hydroxide was calcined at 1000° C., so that white powder was obtained. The white powder, when analyzed by an ICP optical emission spectrometry, showed an MgO purity of 99.8 wt %, an X-ray diffraction pattern with a main peak attributed to magnesium oxide, a peak intensity at 2θ=42.879° of 17291 cps, a BET specific surface area of 14.7 m$^2$/g, and an α dose of 0.011±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 0.89 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 0.88 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 7

[Step of Calcining Magnesium Hydroxide to Produce Magnesium Oxide]

By the same procedure as that in Comparative Example 6, the step of producing magnesium hydroxide by neutralizing an aqueous magnesium chloride solution was performed, and white powder mainly containing the magnesium hydroxide obtained was calcined at 1100° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.889° of 20034 cps, a BET specific surface area of 3.65 m$^2$/g, and an α dose of 0.011±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 0.92 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 0.9 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 8

[Step of Calcining Magnesium Hydroxide to Produce Magnesium Oxide]

By the same procedure as in Comparative Example 6, the step of producing magnesium hydroxide by neutralizing an aqueous magnesium chloride solution was performed, and white powder mainly containing the magnesium hydroxide obtained was calcined at 1250° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at 2θ=42.885° of 25855 cps, a BET specific surface area of 1.76 m$^2$/g, and an α dose of 0.011±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 0.99 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 0.95 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 9

[Step of Calcining Magnesium Hydroxide to Produce Magnesium Oxide]

By the same procedure as that in Comparative Example 6, the step of producing magnesium hydroxide by neutralizing an aqueous magnesium chloride solution was performed, and white powder mainly containing the magnesium hydroxide obtained was calcined at 1400° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at 2θ=42.886° of 27192 cps, a BET specific surface area of 0.89 m$^2$/g, and an α dose of 0.011±0.001 c/cm$^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form,—put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.03 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.03 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Comparative Example 10

While 1980 mL of a 200 g/L aqueous solution of magnesium chloride (extra-pure reagent from Wako Pure Chemical Industries, Ltd.) was stirred, 485 mL of a 725 g/L aqueous solution of sodium hydroxide (extra-pure reagent from Wako Pure Chemical Industries, Ltd.) was added at a rate of 8.08 mL/min over 1 hour, so that a precipitate of magnesium hydroxide was formed. The precipitate was filtered, washed with water until the filtrate had an electrical conductivity of 100 μs/cm or lower, and formed into a slurry again. To the slurry was added 10 mL of the filtrate (aqueous magnesium chloride solution from which α-ray-emitting substances were removed) obtained in Example 1. The mixture was stirred for 15 minutes, and dried at 130° C. for 2 hours, so that white powder was obtained. The white powder, when analyzed by an ICP optical emission spectrometry, showed an Mg content of 41.8 wt %, and an X-ray diffraction pattern with a main peak attributed to magnesium hydroxide.

[Step of Calcining Magnesium Hydroxide to Produce Magnesium Oxide]

White powder mainly containing the magnesium hydroxide obtained above was calcined at 1400° C., so that white powder was obtained. The white powder, when analyzed by an ICP optical emission spectrometry, showed an MgO purity of 99.6 wt %, an X-ray diffraction pattern with a main peak attributed to magnesium oxide, a peak intensity at $2\theta=42.887°$ of 28396 cps, a BET specific surface area of 0.19 $m^2$/g, and an α dose of 0.012±0.001 c/$cm^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of EEA resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.51 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.5 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

Reference Example 1

[Step of Removing α-Ray-Emitting Substances from Aqueous Magnesium Chloride Solution]

In a 3-L beaker, 1000 mL of a 396 g/L aqueous solution of magnesium chloride (extra-pure reagent from Wako Pure Chemical Industries, Ltd.), 570 mL of a 200 g/L slurry of a titanium compound mainly containing hydrous titanium oxide (from Sakai Chemical Industry Co., Ltd.), and 500 mL of pure water were mixed by stirring. To the mixture was added an aqueous solution of sodium hydroxide (extra-pure reagent from Wako Pure Chemical Industries, Ltd.) to control the pH to 5. The mixture was stirred at 25° C. for 24 hours, and then filtered so that an aqueous magnesium chloride solution (filtrate) from which the titanium compound mainly containing hydrous titanium hydroxide and α-ray-emitting substances were removed was obtained.

Here, the titanium compound mainly containing hydrous titanium oxide showed a weight loss of 14.0% by mass when heated at 400° C., had a BET specific surface area of 224 $m^2$/g, and exhibited a ratio of an X-ray diffraction peak intensity (cps) at a Bragg angle (2θ) of 25.20° to 25.60° to the minimum intensity (cps) of the background of 19.3.

[Step of Neutralizing Aqueous Magnesium Chloride Solution from which α-Ray-Emitting Substance was Removed, to Produce Magnesium Carbonate]

While the filtrate (aqueous magnesium chloride solution from which α-ray-emitting substances were removed) was stirred, 1000 mL of a 135 g/L aqueous solution of sodium carbonate (extra-pure reagent from Wako Pure Chemical Industries, Ltd.) was added at a rate of 16.67 mL/min over 1 hour, so that a precipitate of basic magnesium carbonate was formed. The precipitate of basic magnesium carbonate was filtered, washed with water until the filtrate had an electrical conductivity of 100 μs/cm or lower, and dried at 130° C. for 2 hours, whereby white powder was obtained.

The white powder, when analyzed by an ICP optical emission spectrometry (SPS 3100-24HV from SII Nano-Technology Inc.), showed an Mg content of 20.0 wt %, and an X-ray diffraction pattern with a main peak attributed to basic magnesium carbonate ($Mg_5(CO_3)_4(OH)_2(H_2O)_4$).

[Step of Calcining Basic Magnesium Carbonate to Produce Magnesium Oxide]

White powder mainly containing the basic magnesium carbonate obtained above was calcined at 1000° C., so that white powder was obtained. The white powder, when analyzed by an ICP optical emission spectrometry, showed an MgO purity of 99.7 wt %, an X-ray diffraction pattern with a main peak attributed to magnesium oxide, a peak intensity at $2\theta=42.888°$ of 30522 cps, a BET specific surface area of 14.8 $m^2$/g, and an α dose of 0.010±0.001 c/$cm^2$/h.

[Measurement of Heat Conductivity of EEA Resin Molded Body]

A LABO PLASTOMILL (10C 100 from Toyo Seiki Seisakusho, Ltd.) was charged with 59.5 g of the magnesium oxide obtained by the method above and 10.0 g of ethylene-ethylacrylate copolymer (EEA) resin (A-1150 from Japan Polyethylene Corporation). The components were kneaded at an internal device temperature of 150° C. and a rotor speed of 40 rpm for 10 minutes, and thereby an EEA resin composition was produced. The produced EEA resin composition was poured into the middle portion of a 2-mm-thick mold form, put between ferrotype plates, pressed by a steam press (from Gonno Yuatsuki Seisakusyo, Ltd.) at 150° C. with a pressure of 25 MPa, and hollowed out into a circular shape with a diameter of 50 mm. The circular product was fitted into a 50 mm (diameter)×2 mm (thickness) mold form, put between ferrotype plates, and pressed again by the steam press at 150° C. with a pressure of 25 MPa. Thereby, an EEA resin molded body was produced. The heat conductivity of the produced EEA resin molded body measured by a heat conductivity tester HC-110 from EKO Instruments Co., Ltd. was 1.81 W/mK.

[Measurement of Heat Conductivity of Epoxy Resin Molded Body]

In an ointment jar, 6.52 g of epoxy resin (Epicoat 828 from Mitsubishi Chemical Corporation), 5.22 g of a curing agent (RIKACID MH-700 from New Japan Chemical Co., Ltd.), and 0.50 g of a curing accelerator (N,N-dimethylbenzylamine reagent) were mixed well with a Teflon stick. Then, 59.5 g of the magnesium oxide obtained by the method above was added. The mixture was supplied to a Planetary Centrifugal Mixer "THINKY MIXER" (ARE-250 from Thinky Corporation), kneaded at 2000 rpm for 5 minutes, and deaerated at 2100 rpm for 2 minutes. The sample taken out was passed through a three roll mill (EXAKT 80S from Exakt Technologies, Inc.) with a roll distance of 10 μm and a rotational speed of 200 rpm for 10 times, so that an epoxy resin composition was produced. The produced epoxy resin composition was poured into a 50 mm (diameter)×2 mm (thickness) mold form, put between ferrotype plates, and pressed with a press (from Gonno Yuatsuki Seisakusyo, Ltd.) at ordinary temperature with a pressure of 25 MPa for 10 minutes. The composition was then allowed to stand in a 120° C. dryer for 12 hours to be cured into an epoxy resin molded body. The heat conductivity of the produced epoxy resin molded body measured by a heat conductivity tester HC-110 from EKO Instruments Co., Ltd. was 1.79 W/mK.

The measurements of the BET specific surface area, X-ray diffraction, and α dose were performed by the methods described in Example 1. The following Table 1 shows the values obtained using the X-ray diffraction pattern at the calcining temperature in the above example, namely the 2θ value, the peak intensity of the main peak, the BET specific surface area, and the heat conductivities of the EEA resin molded body and epoxy resin molded body.

TABLE 1

|  | Firing temperature (° C.) | 2θ (°) | Peak intensity (cps) | BET specific surface area (m²/g) | Heat conductivity (W/mK) MgO-containing EEA resin | Heat conductivity (W/mK) MgO-containing epoxy resin |
|---|---|---|---|---|---|---|
| Example 1 | 1000 | 42.886 | 35004 | 15.2 | 2.41 | 2.2 |
| Example 2 | 1100 | 42.888 | 55696 | 3.61 | 2.68 | 2.33 |
| Example 3 | 1250 | 42.89 | 58294 | 1.69 | 2.97 | 2.64 |
| Example 4 | 1400 | 42.889 | 60593 | 0.92 | 3.05 | 2.8 |
| Example 5 | 1400 | 42.892 | 62791 | 0.18 | 3.32 | 3.02 |
| Comparative Example 1 | 1000 | 42.887 | 30491 | 14.5 | 1.74 | 1.65 |
| Comparative Example 2 | 1100 | 42.889 | 39629 | 3.71 | 1.78 | 1.68 |
| Comparative Example 3 | 1250 | 42.888 | 44394 | 1.75 | 1.9 | 1.84 |
| Comparative Example 4 | 1400 | 42.891 | 48693 | 0.95 | 1.93 | 1.85 |
| Comparative Example 5 | 1400 | 42.889 | 50998 | 0.2 | 2.31 | 2.21 |
| Example 6 | 1000 | 42.885 | 22095 | 13.2 | 1.36 | 1.29 |
| Example 7 | 1100 | 42.887 | 29976 | 3.59 | 1.39 | 1.33 |
| Example 8 | 1250 | 42.886 | 34781 | 1.73 | 1.59 | 1.57 |
| Example 9 | 1400 | 42.889 | 36293 | 0.81 | 1.61 | 1.58 |
| Example 10 | 1400 | 42.889 | 37595 | 0.17 | 1.95 | 1.9 |
| Comparative Example 6 | 1000 | 42.879 | 17291 | 14.7 | 0.89 | 0.88 |
| Comparative Example 7 | 1100 | 42.889 | 20034 | 3.65 | 0.92 | 0.9 |
| Comparative Example 8 | 1250 | 42.885 | 25855 | 1.76 | 0.99 | 0.95 |
| Comparative Example 9 | 1400 | 42.886 | 27192 | 0.89 | 1.03 | 1.03 |
| Comparative Example 10 | 1400 | 42.887 | 28396 | 0.19 | 1.51 | 1.5 |
| Reference Example 1 | 1000 | 42.888 | 30522 | 14.8 | 1.81 | 1.79 |

Figure 2:
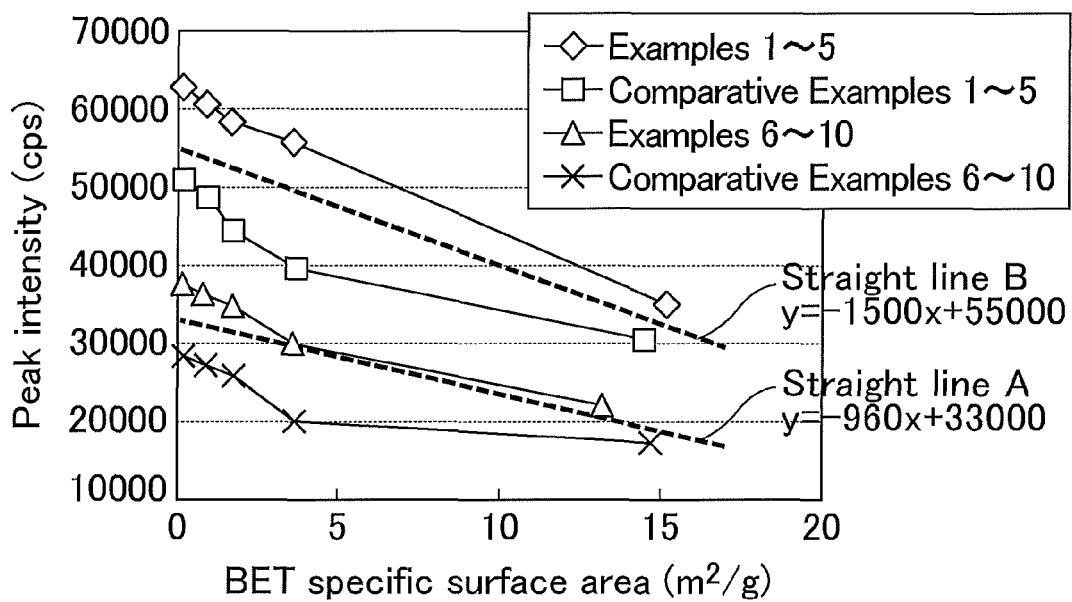
FIG. 2 is a graph showing the results of examples and comparative examples in the present invention.

FIG. 2 is a graph showing the results of the examples and comparative examples, with the X-ray diffraction peak intensity y (cps) plotted in the vertical direction and the BET specific surface area x (m²/g) plotted in the horizontal direction.

These results reveal that the magnesium oxides obtained in Examples 1 to 10 exhibited greatly reduced α doses compared to the magnesium oxides obtained in Comparative Examples 1 to 10.

Also, as shown in Table 1 and FIG. 2, the magnesium oxides obtained in Examples 1 to 10 exhibited higher peak intensities at the same calcining temperature and higher heat conductivities of the EEA resin composition and epoxy resin composition than the magnesium oxides obtained in Comparative Examples 1 to 10.

The invention claimed is:

1. Magnesium oxide particles having
a BET specific surface area in a range from 0.1 to 17 m²/g, and
an α dose in a range of 0.005 c/cm²·Hr or lower,
wherein the particles exhibit a relation between an X-ray diffraction peak intensity y (cps) at a Bragg angle (2θ) in a range from 42.80° to 43.00° and the BET specific surface area x (m²/g) as represented by following formula (1):

$$y \geq -960x + 33000 \quad (1).$$

2. The magnesium oxide particles according to claim 1, wherein the particles exhibit a relation between a peak intensity y (cps) at a Bragg angle (2θ) in the range from 42.80° to 43.00° and the BET specific surface area x (m²/g) as represented by following formula (2):

$$y \geq -1500x + 55000 \quad (2).$$

3. The magnesium oxide particles according to claim 1, wherein the BET specific surface area is in a range from 0.1 to 5 m²/g.

4. A method for producing magnesium oxide particles comprising:
step 1 of adding a titanium compound mainly comprising hydrous titanium oxide into an aqueous solution of a magnesium compound so as to adsorb an α-ray-emitting substance on the titanium compound;
step 2 of filtering the aqueous solution comprising the titanium compound from step 1 so as to separate and remove the titanium compound with the α-ray-emitting substance adsorbed thereon;
step 3 of adding an alkali metal hydroxide, or an alkali metal carbonate, or a combination thereof into the aqueous solution resulting from step 2; and
step 4 of separating by filtration a precipitated compound resulting from the addition of the alkali metal hydroxide, or the alkali metal carbonate, or the combination thereof, and calcining the precipitated compound.

5. The production method according to claim 4, wherein the titanium compound shows (i) a weight loss of 16% by mass or less when heated at 400° C., (ii) has a BET specific surface area in a range from 150 to 250 m²/g, and (iii) exhibits that a ratio of an X-ray diffraction peak intensity (cps) at a Bragg angle (2θ) in a range from 25.20° to 25.60° relative to a minimum intensity (cps) of a background is in a range from 10 to 50.

6. The production method according to claim 4, wherein the aqueous solution in the step 1 has a pH in a range from 6 to 7.

7. The production method according to claim 4, wherein a calcining temperature in the step 4 is in a range from 900° C. to 1500° C.

8. The production method according to claim 4, wherein the alkali metal carbonate is sodium carbonate.

9. A resin composition, comprising
the magnesium oxide particles according to claim 1.

10. The resin composition according to claim 9, wherein the resin contained in the resin composition is an epoxy resin.

11. A molded body or an adhesive, formed from the resin composition according to claim 9.

12. Grease, comprising
the magnesium oxide particles according to claim 1.

* * * * *